United States Patent
Urben

(10) Patent No.: US 7,407,084 B2
(45) Date of Patent: Aug. 5, 2008

(54) METHOD FOR MOUNTING A SEMICONDUCTOR CHIP ONTO A SUBSTRATE

(75) Inventor: Matthias Urben, Lucerne (CH)

(73) Assignee: Unaxis Trading Ltd, Cham (CH)

( * ) Notice: Subject to any disclaimer, the term of this patent is extended or adjusted under 35 U.S.C. 154(b) by 0 days.

(21) Appl. No.: 11/294,919

(22) Filed: Dec. 5, 2005

(65) Prior Publication Data

US 2006/0118602 A1 Jun. 8, 2006

(30) Foreign Application Priority Data

Dec. 6, 2004 (CH) .................................... 2014/04

(51) Int. Cl.
*B23K 31/02* (2006.01)
(52) U.S. Cl. ............... 228/180.21; 228/233.1; 228/233.2
(58) Field of Classification Search .......... 228/180.21, 228/6.2, 44.7, 49.5
See application file for complete search history.

(56) References Cited

U.S. PATENT DOCUMENTS

| | | | |
|---|---|---|---|
| 3,056,317 A * | 10/1962 | Huber et al. ................ 228/6.2 |
| 5,632,434 A * | 5/1997 | Evans et al. ................ 228/44.7 |
| 5,655,700 A | 8/1997 | Pham et al. |
| 5,673,844 A * | 10/1997 | Sargent ........................ 228/102 |
| 5,839,187 A | 11/1998 | Sato et al. |
| 6,131,795 A * | 10/2000 | Sato ............................ 228/102 |
| 6,189,208 B1 * | 2/2001 | Estes et al. ..................... 29/840 |
| 6,471,110 B1 * | 10/2002 | Luechinger et al. ......... 228/102 |
| 6,518,095 B1 * | 2/2003 | Akutsu ........................ 438/118 |
| 6,616,031 B2 * | 9/2003 | Wong et al. .................. 228/102 |
| 6,621,157 B1 | 9/2003 | Wirz et al. |
| 6,677,179 B2 | 1/2004 | Yin et al. |
| 6,753,614 B2 | 6/2004 | Yamazaki et al. |
| 6,798,072 B2 * | 9/2004 | Kajiwara et al. ............ 257/778 |
| 6,848,338 B1 | 2/2005 | Gieskes et al. |
| 6,913,945 B2 | 7/2005 | Yamauchi et al. |
| 7,117,913 B2 * | 10/2006 | Sasaki ........................ 156/358 |
| 7,341,642 B2 * | 3/2008 | Kumakura ................ 156/273.5 |
| 2001/0016372 A1 | 8/2001 | Murakami |
| 2003/0022534 A1 | 1/2003 | Terada et al. |
| 2003/0101576 A1 | 6/2003 | Hartmann |
| 2003/0115747 A1 | 6/2003 | Schnetzler et al. |
| 2004/0105750 A1 | 6/2004 | Bolliger et al. |

(Continued)

FOREIGN PATENT DOCUMENTS

DE 101 51 657 2/2003

(Continued)

OTHER PUBLICATIONS

Search Report: Application No. 094142061; Wenping & Co.; Sep. 24, 2007, 1 pg.

*Primary Examiner*—Kiley Stoner
(74) *Attorney, Agent, or Firm*—Thelen Reid Brown Raysman & Steiner LLP; David B. Ritchie

(57) ABSTRACT

A method for mounting a semiconductor chip onto a substrate the side of which facing towards the substrate is coated with an adhesive layer is characterised by the following steps:
(1) Lowering the semiconductor chip until the semiconductor chip touches the substrate,
(2) Waiting a predetermined period of time during which a force exerted on the semiconductor chip disappears or is at least comparatively small, and
(3) Applying a bond force.

12 Claims, 3 Drawing Sheets

U.S. PATENT DOCUMENTS

Figure 1:
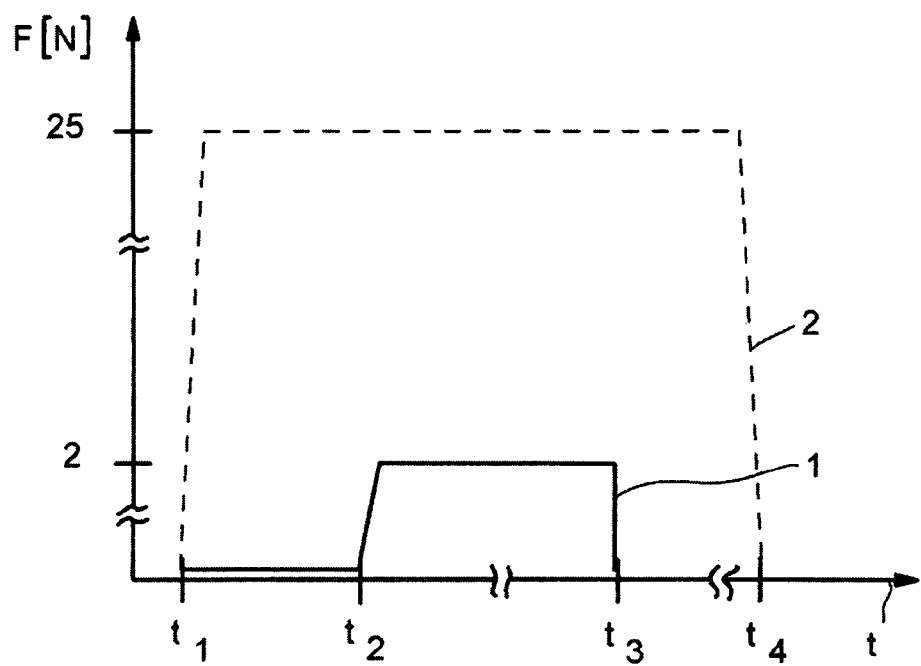

2004/0217100 A1* 11/2004 Ogimoto et al. .............. 219/243
2005/0221582 A1* 10/2005 Lee et al. .................... 438/455

FOREIGN PATENT DOCUMENTS

| | | |
|---|---|---|
| EP | 1 278 232 A2 | 1/2003 |
| JP | 60-16432 | 1/1985 |
| JP | 1-272125 | 10/1989 |
| JP | 405190744 A * | 7/1993 |
| JP | 2003-229442 | 8/2003 |
| WO | WO 94/27823 | 12/1994 |
| WO | 96/13066 | 5/1996 |
| WO | 01/52317 A1 | 7/2001 |

* cited by examiner

US 7,407,084 B2

METHOD FOR MOUNTING A SEMICONDUCTOR CHIP ONTO A SUBSTRATE

PRIORITY CLAIM

The present application claims priority under 35 U.S.C § 119 based upon Swiss Patent Application No. 2014/04 filed Dec. 6, 2004.

FIELD OF THE INVENTION

The invention concerns a method for mounting a semiconductor chip onto a substrate.

BACKGROUND OF THE INVENTION

With the mounting of semiconductor chips, the semiconductor chips sawn out of a wafer and adhering to a foil are picked one after the other by the chip gripper of a bondhead and placed onto a substrate. Before sawing, the wafers are ground in order to reduce their thickness. For this reason, the semiconductor chips to be mounted become increasingly thinner. Semiconductor chips the thickness of which amounts to 150 micrometers or more are mostly mounted by conventional means with which adhesive is applied to the substrate at a dispensing station and then the semiconductor chip is placed onto the substrate at a bonding station. For mounting semiconductor chips the thickness of which amounts to 100 micrometers or less, a new process has been developed with which the wafer is coated with an adhesive layer after grinding to its thickness. In the art, this process is known as WBL (Wafer Backside Lamination) process. For mounting the semiconductor chips, the application of adhesive at a dispensing station is therefore omitted. Mounting takes place in such a way that the semiconductor chip is placed onto the substrate and a predefined bond force is applied to it for a predefined period. In doing so, the substrate is kept at a temperature of typically around 150° C. so that the adhesive liquefies and adapts itself to the surface structure of the substrate so that a good quality connection is made. It has now become apparent that air voids remain in the adhesive layer between the semiconductor chip and the substrate and/or areas free of adhesive remain underneath the corners and edges of the semiconductor chip. This leads to problems with the encapsulation of the semiconductor chip. In particular it can happen that the semiconductor chip detaches itself from the substrate whereby the dissipation of heat loss occurring during operation of the semiconductor chip is greatly impaired. Attempts are now being made to reduce the number and size of the air voids by means of increasing the bond force to 25 N or more. In order to be able to apply such large bond forces, bond force amplifiers are also used.

BRIEF DESCRIPTION OF THE INVENTION

The object of the invention is to specify a method for mounting semiconductor chips that have an adhesive layer on the back with which the above-named problems are eliminated.

The invention uses a conventional die bonding apparatus comprising a pick and place system having a bondhead with a chip gripper for picking the semiconductor chip preferably from a wafer table and placing it on the substrate and consists in that the semiconductor chip is placed onto the substrate and that the bond force is only applied with some delay, namely when the adhesive layer has liquefied. The temperature of the substrate amounts typically to 150° C. When the adhesive layer on the back of the semiconductor chip comes into contact with the hot substrate, it liquefies. The time $\tau$ that elapses until the adhesive layer has completely liquefied is dependent on the temperature of the substrate and on the characteristics of the adhesive. With a trial example, the time $\tau$ was around 200 ms.

The placement of the semiconductor chip on the substrate in accordance with the invention is therefore characterized by the following steps:

(1) lowering the semiconductor chip until the semiconductor chip touches the substrate, (2) waiting a predetermined period of time $\tau$ during which the force exerted on the semiconductor chip by the chip gripper substantially disappears or is relatively small compared to the bond force to be applied to the semiconductor chip in the subsequent step (3), and (3) applying the bond force to the semiconductor chip.

The time duration $\tau$ of process step (2) is predefined so that the adhesive layer liquefies before the bond force is applied in process step (3). The force during process step (2) is as small as possible. For a bondhead with which the chip gripper has a spring bearing, the force during process step (2) corresponds roughly to the weight of the chip gripper itself and possibly a very small spring force because, during process step (2), the chip gripper is already slightly deflected in relation to the bondhead. For a bondhead with which the chip gripper has a pneumatic bearing, the force during process step (2) corresponds roughly to the weight of the chip gripper itself. The weight of the chip gripper amounts typically to 0.1 to 0.2 N (Newton). However, there are also Die Bonders with which the minimum adjustable bond force amounts to around 0.5 N. Even when the force exerted on the semiconductor chip during process step (2) amounts to 0.5N, this force is small enough in order to achieve considerable improvements in comparison with the conventional process as far as the size and number of air voids is concerned.

The application of the bond force in process step (3) means that the force exerted by the chip gripper on the semiconductor chip is greatly increased after the time period $\tau$ has elapsed, namely from the force essentially given by the own weight of the chip gripper to the desired bond force. In principle, the bond force to be applied during process step (3) can be just as great as with the conventional process with which the process step (2) is missing. However it has been shown that with the process in accordance with the invention, the bond force applied during process step (3) no longer has to be unduly increased as described in the introduction. In most cases, the bond force amounts to at least 2 N. The bond force is therefore four times greater when the force exerted during process step (2) reaches the maximum value of 0.5 N. The bond force is even ten times greater when the force exerted during process step (2) amounts to 0.2 N.

The semiconductor chip is held by a chip gripper known in the art as a "die collet" or "die bonding tool". The chip gripper bears in a bondhead and the bond force to be applied is exerted by the bondhead. The surface of the chip gripper that accommodates the semiconductor chip can be formed flat or convex. When this surface is flat, then the entire adhesive layer comes into contact with the substrate and the adhesive is heated by means of contact heat. When this surface is convex as described in the US patent application US 2003-0115747, then only part of the adhesive layer comes into direct contact with the substrate. In this case, the liquefaction of the adhesive takes place by means of contact heat as well as radiant heat. When the bond force is applied after the liquefaction of the adhesive, then the convex surface is pressed flat and the entire adhesive layer comes into contact with the substrate. In doing so, the semiconductor chip is rolled onto the substrate whereby the air can continuously escape.

BRIEF DESCRIPTION OF THE DRAWING FIGURES

Figure 2:
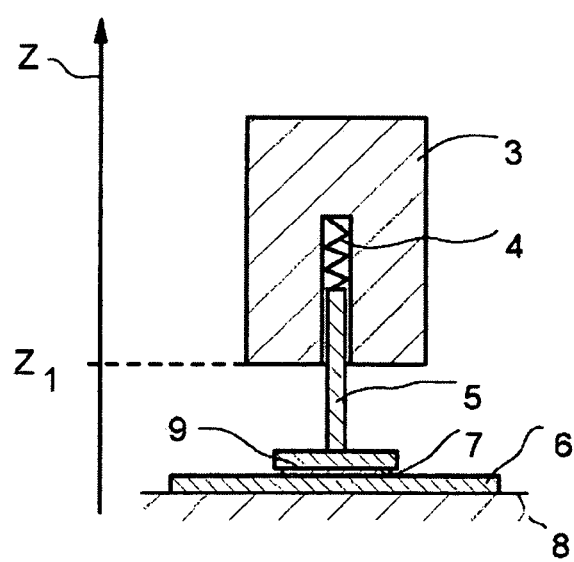
Figure 3:
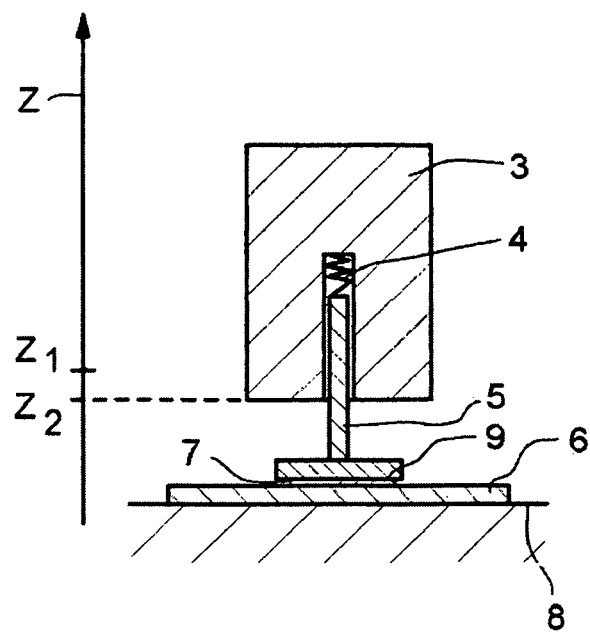
Figure 4:
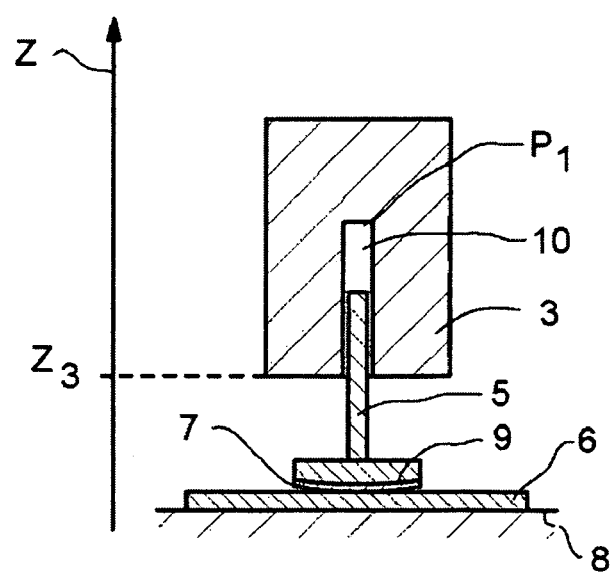
Figure 5:
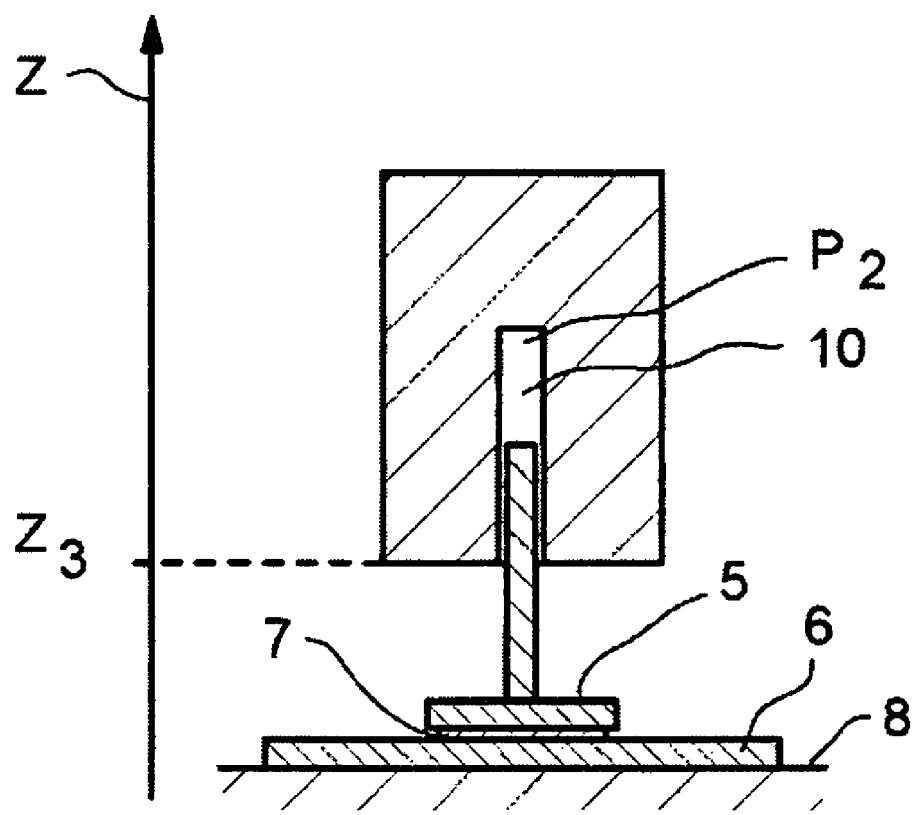

The accompanying drawings, which are incorporated into and constitute a part of this specification, illustrate one or more embodiments of the present invention and, together with the detailed description, serve to explain the principles and implementations of the invention. The figures are not to scale. In the drawings:

FIG. 1 shows a diagram that illustrates the forces applied on mounting the semiconductor chip, FIGS. 2, 3 show snapshots during mounting of the semiconductor chip with a chip gripper that bears in the bondhead by means of a spring, and FIGS. 4, 5 show snapshots during mounting of the semiconductor chip with a chip gripper that bears pneumatically in the bondhead.

DETAILED DESCRIPTION OF THE INVENTION

FIG. 1 shows a diagram that presents the course of the force exerted on a semiconductor chip during mounting of the semiconductor chip onto a substrate. The solid line 1 illustrates the course of the force with the method in accordance with the invention, the broken line 2 illustrates the course of the force in accordance with the conventional method described in the introduction. Mounting of the semiconductor chip takes place by means of a automatic assembly machine known in the art as a Die Bonder that, amongst other things, comprises a Pick and Place system with a bondhead with a chip gripper. The Pick and Place system serves to move the bondhead with the chip gripper back and forth with high accuracy between a pick location where the semiconductor chip presented on a wafer table is picked by the chip gripper and a place location where the semiconductor chip is lowered onto the substrate and to place the semiconductor chip onto the substrate with high positional accuracy. The chip gripper bears in the bondhead. On mounting the semiconductor chip, the bondhead produces the force.

At time $t_1$, the semiconductor chip comes into contact with the substrate heated to a predefined temperature. The own weight of the chip gripper presses the semiconductor chip against the substrate. The own weight of the chip gripper is dependent on its size and design and amounts typically to around 0.1 to 0.2 N. After a predetermined time duration $\tau$ has elapsed, a considerably greater force in comparison with the own weight of the chip gripper, the so-called bond force, is applied at time $t_2$. In a relatively short time, the bond force achieves a predetermined level. With a chip size of $7*10\,mm^2$, the bond force amounts typically to between 2 and 5 N, maximum around 15 N. In the example, the bond force amounts to only 2 N. At time $t_3$, the mounting phase is concluded and the bondhead and the chip gripper are released from the semiconductor chip and raised.

As a comparison, the broken line 2 shows the course of the force with a conventional mounting method according to the prior art with which the bond force is already built up at time $t_1$ and with which as a rule the bond force is greater, for a semiconductor chip of $7*10\,mm^2$ namely around 25 N. Furthermore, the necessary bond time tends to be greater than with the method in accordance with the invention, i.e., with the conventional mounting method, the mounting phase is only concluded at time $t_4$.

FIGS. 2 and 3 illustrate the mounting process in accordance with the invention based on the example of a bondhead 3 with which the bond force is produced by means of a spring 4. The chip gripper 5 bears moveably along a longitudinal axis of the bondhead 3. During transport of the bondhead 3 from the pick location to the substrate 6, the chip gripper 5 is in a neutral position. The bondhead 3 moves to the foreseen position above the substrate 6 and the bondhead 3 is lowered in z direction together with the chip gripper 5. The height of the bondhead 3 measured in z direction is regulated software-controlled in a known way. As soon as the semiconductor chip 7 touches the substrate 6 that is supported and heated by a support 8 the chip gripper 5 comes to rest. When the bondhead 3 is lowered further, then the chip gripper 5 is deflected in relation to the bondhead 3 and the spring 4 compressed. The own weight of the chip gripper and the compressed spring 4 produce the total force exerted on the semiconductor chip. This force is therefore essentially dependent on the degree of deflection of the chip gripper 5 in relation to bondhead 3. The bondhead 3 contains a so-called touchdown sensor. The touchdown sensor is, for example, an inductive sensor formed from a flat coil attached to the bondhead 3 and a metallic plate attached to the chip gripper 5, the output signal of which is proportional to the distance between the metallic plate and the flat coil. With this example, the surface 9 of the chip gripper 5 accommodating the semiconductor chip 7 is a flat surface. With this type of bondhead, mounting of the semiconductor chip 7 onto the substrate takes place in accordance with the following steps:

Lowering the bondhead 3 in z direction until the level P of the output signal of the touchdown sensor undergoes a predetermined level change $\Delta P$. The value of the level change $\Delta P$ is selected so that the chip gripper 5 is only deflected from the neutral position by a very small distance in relation to the bondhead 3 so that the spring 4 does not yet exert any significant force on the chip gripper 5. The time at which the level change $\Delta P$ occurs is the time $t_1$. The bondhead 3 has reached the height $z_1$. This condition is presented in FIG. 2.

The bondhead 3 remains at height $z_1$ for a predetermined time duration $\tau$.

After the time duration $\tau$ has elapsed, at time $t_2=t_1+\tau$, the bondhead 3 is lowered to a new height $z_2$. The height $z_2$ is selected so that the own weight of the chip gripper and the force created by the spring 4 produce the desired bond force.

The bondhead 3 remains at height $z_2$ for a predetermined time duration $\tau_2$. This condition is presented in FIG. 3.

After the time duration $\tau_2$ has elapsed, at time $t_3=t_2+\tau_2$, the bondhead 3 is raised until the chip gripper 5 is released from the semiconductor chip 7 and then moved to the pick location in order to pick the next semiconductor chip.

FIGS. 4 and 5 illustrate the mounting process in accordance with the invention based on the example of a bondhead 3 with which the bond force is produced pneumatically. The chip gripper 5 again bears moveably along the longitudinal axis of the bondhead 3. In addition, pressure from a pressure chamber 10 is applied to the chip gripper 5. The touchdown sensor is also present. With this example, the surface 9 of the chip gripper 5 accommodating the semiconductor chip is a convex surface. The naked eye can not detect that the surface 9 is convex. In FIG. 4 however, for illustrative reasons, the surface 9 is presented in such a way that the curvature of the surface 9 is visible. With this type of bondhead, mounting of the semiconductor chip 7 onto the substrate 6 takes place in accordance with the following steps:

Lowering the bondhead 3 in z direction to a predetermined height $z_3$. The pressure $p_1$ prevailing in the pressure chamber 10 is selected on the one hand so that the chip gripper 5 rests in its neutral position on a not presented stop on the bondhead 3. As soon as the semiconductor chip 7 touches the substrate 6, the chip gripper 5 is deflected from the neutral position. The time at which the level change $\Delta P$ of the touchdown sensor occurs is the time $t_1$. On the other hand, the pressure $p_1$ prevailing in the pressure chamber 10 is selected so that the pressure $p_1$ exerts no significant force on the chip gripper 5. The surface 9 is therefore still convex. This condition is presented in FIG. 4.

The bondhead 3 remains at the height $z_3$. The pressure in the pressure chamber 10 remains for a predetermined time duration $\tau$ at the value $p_1$ or is lowered to the value 0.

After the time duration $\tau$ has elapsed, at time $t_2=t_1+\tau$, the pressure prevailing in the pressure chamber 10 is increased to the value $p_2$. The pressure $p_2$ is selected so that the own weight of the chip gripper and the force created by the pressure chamber 10 produce the desired bond force. The bond force is preferably selected high enough so that the surface 9 temporarily loses its convex shape and becomes flat. This condition is presented in FIG. 5. With the transition from the convex shape to the flat shape, the semiconductor chip 7 is rolled onto the substrate 6 so that the air can easily escape.

The pressure in the pressure chamber 10 remains at the value $p_2$ for a predetermined time duration $\tau_2$.

After the time duration $\tau_2$ has elapsed, at time $t_3=t_2+\tau_2$, the bondhead 3 is raised until the chip gripper 5 is released from the semiconductor chip 7 and then moved to the pick location in order to pick the next semiconductor chip.

With both bondhead types, the surface 9 of the chip gripper 5 accommodating the semiconductor chip 7 can be flat or convex. The touchdown sensor can also be a switch contact that is closed as long as the chip gripper 5 is in its neutral position and which is opened when the chip gripper 5 is deflected from the neutral position.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for mounting a semiconductor chip onto a substrate, the semiconductor chip having a side facing towards the substrate coated with an adhesive layer, wherein the semiconductor chip is picked by a chip gripper of a bondhead and placed on the substrate, the method comprising:
   lowering the semiconductor chip until the semiconductor chip touches the substrate;
   waiting a predetermined period of time during which a force exerted by the chip gripper on the semiconductor chip substantially disappears or is at least relatively small compared to a bond force to be applied to the semiconductor chip subsequently, wherein said predetermined period of time is predefined such that said adhesive layer liquefies; and
   applying the bond force to the semiconductor chip immediately after the predetermined period of time.

2. The method according to claim 1, wherein said force exerted on the semiconductor chip is less than 0.5 N.

3. The method according to claim 1, wherein said bond force amounts to at least 2 N.

4. The method according to claim 2, wherein said bond force amounts to at least 2 N.

5. The method according to claim 1, wherein said force exerted on the semiconductor chip is at least four times less than the bond force.

6. The method according to claim 2, wherein said force exerted on the semiconductor chip is at least four times less than the bond force.

7. The method according to claim 3, wherein said force exerted on the semiconductor chip is at least four times less than the bond force.

8. The method according to claim 4, wherein said force exerted on the semiconductor chip is at least four times less than the bond force.

9. A method for mounting a semiconductor chip having an adhesive layer onto a substrate, the method comprising:
   lowering the semiconductor chip having the adhesive layer toward the substrate until the adhesive layer comes into contact with a substrate surface;
   waiting a first period of time while a force applied to the semiconductor chip is substantially zero or relatively small compared to a bond force applied subsequently and allowing the adhesive layer to liquefy; and
   applying the bond force to the semiconductor chip for a second period of time immediately after the first period of time.

10. A method for mounting a semiconductor chip having an adhesive layer onto a substrate, the method comprising:
    gripping the semiconductor chip by a chip gripper extending from a bondhead, wherein the chip gripper is vertically moveable with respect to the bondhead;
    lowering the chip gripper and the bondhead a first downward distance until the adhesive layer of the semiconductor chip comes into contact with a substrate surface;
    heating the adhesive layer to liquefy the adhesive layer while at least a part of the adhesive layer is in contact with the substrate surface and while a force applied to the semiconductor chip substantially corresponds to a chip gripper weight during a first period of time; and
    applying a bond force to the semiconductor chip by lowering the bondhead a second downward distance with respect to the substrate surface, the bond force being applied immediately after the first period of time, wherein the bond force is greater than the force.

11. The method according to claim 10 wherein the force further comprises an additional force associated with the chip gripper moving vertically toward the bondhead, wherein a spring member is coupled to the chip gripper and the bondhead to produce the additional force.

12. The method according to claim 10 wherein the force further comprises an additional force associated with the chip gripper moving vertically toward the bondhead, wherein a pneumatic system is coupled to the chip gripper and the bondhead to produce the additional force.

* * * * *